(12) United States Patent
Kojima

(10) Patent No.: US 7,834,607 B2
(45) Date of Patent: Nov. 16, 2010

(54) VOLTAGE GENERATOR WITH CURRENT LIMITING AND SEMICONDUCTOR TESTING DEVICE

(75) Inventor: Shoji Kojima, Oizumi-machi (JP)

(73) Assignee: Advantest Corporation, Tokyo (JP)

( * ) Notice: Subject to any disclaimer, the term of this patent is extended or adjusted under 35 U.S.C. 154(b) by 432 days.

(21) Appl. No.: 12/090,614

(22) PCT Filed: Jan. 26, 2007

(86) PCT No.: PCT/JP2007/051295

§ 371 (c)(1),
(2), (4) Date: Apr. 17, 2008

(87) PCT Pub. No.: WO2008/090627

PCT Pub. Date: Jul. 31, 2008

(65) Prior Publication Data

US 2010/0164463 A1    Jul. 1, 2010

(51) Int. Cl.
*G05F 1/46* (2006.01)
*G01R 31/26* (2006.01)

(52) U.S. Cl. .................. 323/293; 323/231; 324/765

(58) Field of Classification Search ................ 323/321, 323/276, 293, 297, 298, 352, 353, 354, 369; 361/91.5, 91.6, 93.9; 324/523, 763, 765
See application file for complete search history.

(56) References Cited

U.S. PATENT DOCUMENTS

| 5,264,781 | A  | * | 11/1993 | Miller et al. ................. 323/282 |
| 5,739,678 | A  | * | 4/1998  | Nagaraj ....................... 323/268 |
| 5,754,041 | A  | * | 5/1998  | Kaito et al. ............... 324/158.1 |
| 7,071,663 | B2 | * | 7/2006  | Okubo et al. ................ 323/276 |
| 7,521,937 | B2 | * | 4/2009  | Nagata ....................... 324/523 |
| 7,579,813 | B2 | * | 8/2009  | Fan ............................ 323/231 |
| 7,602,161 | B2 | * | 10/2009 | McLeod ...................... 323/273 |

(Continued)

FOREIGN PATENT DOCUMENTS

JP        54-022552         2/1979

(Continued)

OTHER PUBLICATIONS

Patent Abstracts of Japan, Publication No. 2002-123320 dated Apr. 26, 2002, 1 page.

(Continued)

*Primary Examiner*—Gary L Laxton
(74) *Attorney, Agent, or Firm*—Osha Liang LLP

(57) ABSTRACT

A voltage generator with current limiting generates a voltage to be fed to a load of which load current is limited. The voltage generator includes an operational amplifier; an output resistance connected between an output terminal of the operational amplifier and a load connecting terminal; a feedback resistor connected between the load connecting terminal and an inverting input terminal of the operational amplifier; a first clamper connected between the output terminal of the operational amplifier and the inverting input terminal of the operational amplifier; and a second clamper connected between the load connecting terminal and a non-inverting input terminal of the operational amplifier and configured with diodes. The first clamper generates a predetermined constant voltage, limits a current flowing into the output resistance, and varies the generated constant voltage. The first clamper has a predetermined abrupt current-voltage characteristic.

19 Claims, 5 Drawing Sheets

U.S. PATENT DOCUMENTS 7,612,549 B1 * 11/2009 Kao et al. .................. 323/281

FOREIGN PATENT DOCUMENTS

| JP | 2002-123320 | 4/2002 |
| JP | 2002-182755 | 6/2002 |
| JP | 2005-293423 | 10/2005 |

OTHER PUBLICATIONS

Patent Abstracts of Japan, Publication No. 2002-182755 dated Jun. 26, 2002, 1 page.
Patent Abstracts of Japan, Publication No. 2005-293423 dated Oct. 20, 2005, 2 pages.
Patent Abstracts of Japan, Publication No. 54-022552 dated Feb. 20, 1979, 1 page.
International Search Report issued in PCT/JP2007/051295 mailed on Apr. 24, 2007, 1 page.
Written Opinion issued in PCT/JP2007/051295 mailed on Apr. 13, 2007, 3 pages.
Notification from the International Bureau along with the English Translation of the International Preliminary Report on Patentability and the Writtein Opinion of the Searching Authority for International Application No. PCT/JP2007/051295, mailed Aug. 6, 2009, 6 pages.

* cited by examiner

F I G. 4
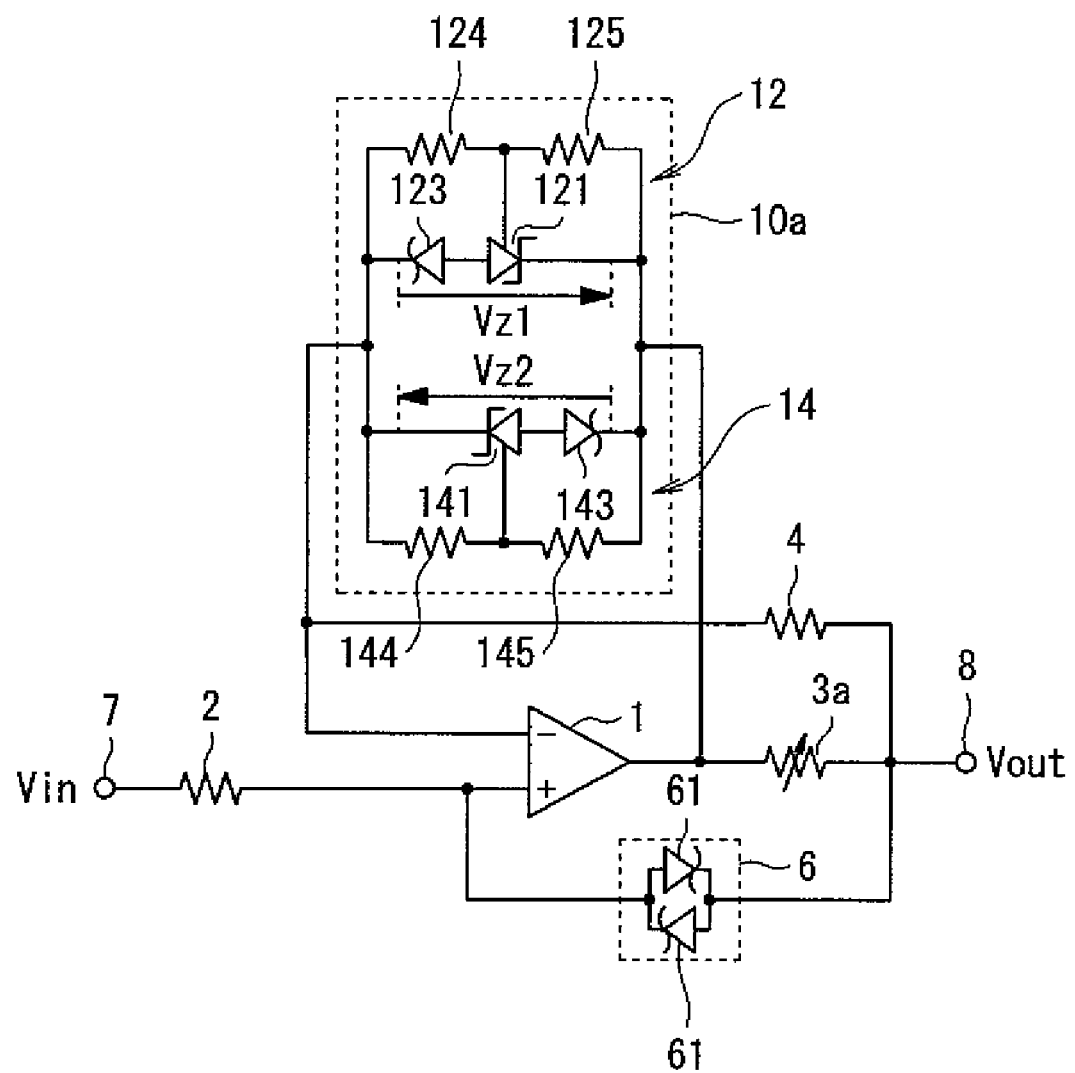

VOLTAGE GENERATOR WITH CURRENT LIMITING AND SEMICONDUCTOR TESTING DEVICE

TECHNICAL FIELD

The present invention relates to a voltage generator for generating a voltage to be fed to a load and limiting the current of the load, in particular, it relates to a voltage generator with a current limiting used for an electronic measuring instrument or a semiconductor testing device.

Also, the present invention relates to a semiconductor testing device to which the voltage generator with a current limiting is applied.

BACKGROUND ART

A voltage generator with a current limiting is used for an electronic measuring instrument or a semiconductor testing device. As a load, an input terminal, an IO terminal, a supply power terminal, and the like, of an electronic component or a device to be tested are included, and they are used for limiting a current to be equal to or less than a specified current to prevent unnecessary stress.

FIG. 6 illustrates an example of the configuration of a conventional voltage generator with a current limiting function, disclosed in Patent Document 1.

As illustrated in FIG. 6, the voltage generator includes an operational amplifier 1 for buffering a current, an input resistance 2, an output resistance 3 for limiting a current, a feedback resistor 4, a clamper 5 for limiting a current, and a clamper 6, and a positive or negative input voltage Vin which can be varied arbitrarily is applied to an input terminal 7. A load 9 is connected to a load connecting terminal 8.

The clamper 5 consists of two circuits in which a plurality of diodes are connected in series, and these circuits are inversely connected in parallel with each other. In the clamper 6, two diodes are inversely connected in parallel with each other.

Next, an example of the operation of the voltage generator with a current limiting function configured in this way will be described with reference to FIG. 6.

A current limiting operation when positive voltage is generated and a load current Iout flows into the load 9 (a case of a source current), will be described.

Now, suppose that a predetermined load voltage Vout is fed to the load 9, and load a current Iout is given. At that time, suppose that the input voltage Vin fed to the input terminal 7 is a positive voltage Vout. If the load current Iout is within the current limiting range, the input voltage Vin is transmitted directly to the operational amplifier 1 by the feedback resistor 4, and Vin=V2=Vout is satisfied. If the load current Iout is flown out from the operational amplifier 1 to the load 9 through the output resistance 3, voltage drop occurs across the both ends of the output resistance 3, and V3>Vout is satisfied. If the load current Iout is within the current limiting range, the output voltage V3 of the operational amplifier 1 arises, but by the feedback resistor 4, Vin=Vout is satisfied.

As the load current Iout approaches to the current limit value, V3−Vout>n×VF is satisfied. Where, VF is a voltage (forward voltage) at which the current of the diodes begins to flow, and in case of a silicone diode, it is around about 0.6 V. n is the number of the diodes connected to the clamper 5 in series. For example, when the number of diodes is two, the above formula becomes 2×VF, that is about 1.2 V. In this manner, as the load current Iout approaches to the current limit value, the forward diode in the clamper 5 becomes an on state, a current i1 begins to flow in the arrow direction in FIG. 6 and flows into the output terminal 8 through the feedback resistor 4, and a negative input terminal voltage V1 of the operational amplifier 1 rises.

As a result, descent of the output voltage V3 of the operational amplifier 1 causes a current to be limited. Since the load voltage Vout descends being accompanied with this, Vin>Vout is satisfied, and a current i2 also flows into the diodes of the clamper 6 in the direction of the arrow. By the current i2 flowing from the input terminal 7 through the input resistance 2, voltage drop occurs, and the positive input terminal voltage V2 of the operational amplifier 1 descends. The descend of the positive input terminal voltage V2 causes the load voltage Vout to descend and the load current Iout to be limited.

Next, the operation when the load current Iout flows into the load connecting terminal 8 (in case of a sink current) is in a case in which the input voltage Vin of the input terminal 7 is a negative voltage, and in this case, the current direction becomes inverse with respect to the direction of the above description but the operation becomes the same as that of the above description.

Patent Document 1: JP2002-123320A

Incidentally, the voltage generator with a current limiting function disclosed in the Patent Document 1 has the following drawbacks. (1) As illustrated in FIG. 7A, in the clamper 5, diodes are connected in multiple stages. For this reason, as illustrated in FIG. 7B, the current-voltage characteristic (hereinafter, referred to as an I/V characteristic) becomes a gently-sloping curve without abrupt current change at a certain voltage.

Accordingly, since in a conventional voltage generator, current is not abruptly limited to a predetermined value when a current value becomes the predetermined value, it is not desirable for application requiring an exact current limitation.

(2) The forward voltage of the diodes constituting the clamper 5 has large temperature dependence. In case of a usual silicon diode, the forward voltage decreases by an order of several mVs per 1° C. For this reason, the conventional voltage generator has drawbacks in that the current value to be limited has large temperature dependence.

(3) In the conventional voltage generator, the I/V characteristic of the clamper 5 becomes as illustrated in FIG. 7B, thereby, the I/V characteristic is determined by the number of connection stages of the diodes. In other words, since the current limit value becomes a fixed value determined by the design value of a circuit, there is a drawback in that a desired current limit value cannot be set.

Therefore, in view of the above-mentioned point, an object of the present invention is to provide a voltage generator with the current limiting function enabling a current limit value to be set arbitrarily, and having a good current limiting characteristic and small temperature dependence of the current limitation, and a semiconductor testing device to which the voltage generator is applied.

DISCLOSURE OF THE INVENTION

The voltage generator with a current limiting function of the present invention, generating a voltage for feeding to a load in which the load current is limited, includes: an operational amplifier; an output resistance connected between the output terminal of the operational amplifier and the load connecting terminal; a feedback resistor connected between the load connecting terminal and an inverting input terminal of the operational amplifier; a first clamper connected between the output terminal of the operational amplifier and the inverting input terminal of the operational amplifier; and a second clamper connected between the load connecting terminal and a non-inverting input terminal of the operational amplifier and configured with diodes; where the first clamper includes constant voltage generating means for generating a predetermined constant voltage and limiting a current flowing into the output resistance; and resistance varying means for varying the constant voltage generated in the constant voltage generating means, and the constant voltage generating means has a predetermined abrupt current-voltage characteristic.

According to this, even if a circuit scale is small, the current limit value can be arbitrarily set at the point of use, and the responsibility during limiting current can also be improved.

As an embodiment of the present invention, the constant voltage generating means is configured so that the temperature dependence of the current-voltage characteristic becomes small. According to this, further, the temperature dependence of the current limitation can also be made small.

In the embodiment of the present invention, the constant voltage generating means consists of first constant voltage generating means for generating a positive constant voltage and second constant voltage generating means for generating a negative constant voltage, and the resistance varying means consists of first resistance varying means for externally varying the positive constant voltage generated by the first constant voltage generating means and setting it to an arbitrary value and second resistance varying means for externally varying the negative constant voltage generated by the second constant voltage generating means and setting it to an arbitrary value. According to this, the upper and lower current limit values can be set arbitrarily at the point of use.

As an embodiment of the present invention, the constant voltage generating means consists of a predetermined voltage reference IC, which sends an operating current to the feedback resistor, and the operating current is within a range that does not affect the current limiting operation. According to this, a commercially available voltage reference IC can be utilized and obtained at a low cost conveniently. Further, even if the commercially available voltage reference IC is used, the current limiting operation is not affected.

As an embodiment of the present invention, the resistance varying means consists of one of a mechanical variable resistor, an electronic volume, and a combination circuit of fixed resistances and switches. According to this, as the resistance varying means various kinds of electronic components can be used if required.

As an embodiment of the present invention, the output resistance is configured with resistance varying means. According to this, the upper and lower current limit values can be set arbitrarily and delicately at the point of use.

As an embodiment of the present invention, the resistance varying means is replaced by a fixed resistance and the output resistance is replaced by resistance varying means. According to this, similar to the above case, even if a circuit scale is small, the current limit value can be arbitrarily set at the point of use, and the responsibility during limiting current can also be improved.

Further, the semiconductor testing device of the present invention is a semiconductor testing device including a voltage generator for generating a desired voltage to be applied to a device to be tested in which as the voltage generator one of the above mentioned voltage generators with a current limiting is applied.

According to this, the voltage generator with a current limiting can be effectively utilized in a semiconductor testing device.

Moreover, the semiconductor testing device of the present invention is a semiconductor testing device including a voltage generator with a current limiting for feeding a predetermined load voltage to a device to be tested that is a load and limiting the load current to be equal to or less than a predetermined value, where the voltage generator with a current limiting includes: an operational amplifier for receiving a voltage signal corresponding to the load voltage by a non-inverting input terminal through an input resistance and feeding a predetermined load voltage to the load; an output resistance connected between the output terminal of the operational amplifier and one end of the load, and having a fixed or an externally variable resistance value; a feedback resistor connected between one end of the load and an inverting input terminal of the operational amplifier; a first clamper connected between the output terminal of the operational amplifier and the inverting input terminal of the operational amplifier and having a pre-set or an externally variable clamp voltage; and a second clamper connected between one end of the load and the non-inverting input terminal of the operational amplifier.

BRIEF DESCRIPTION OF THE DRAWINGS

FIG. 4 is a circuit diagram illustrating the configuration of a second embodiment of the voltage generator with a current limiting function of the present invention;

BEST MODE FOR CARRYING OUT THE INVENTION

Hereinafter, embodiments of the present invention will be described with reference to drawings.

A First Embodiment of the Voltage Generator

Figure 1:
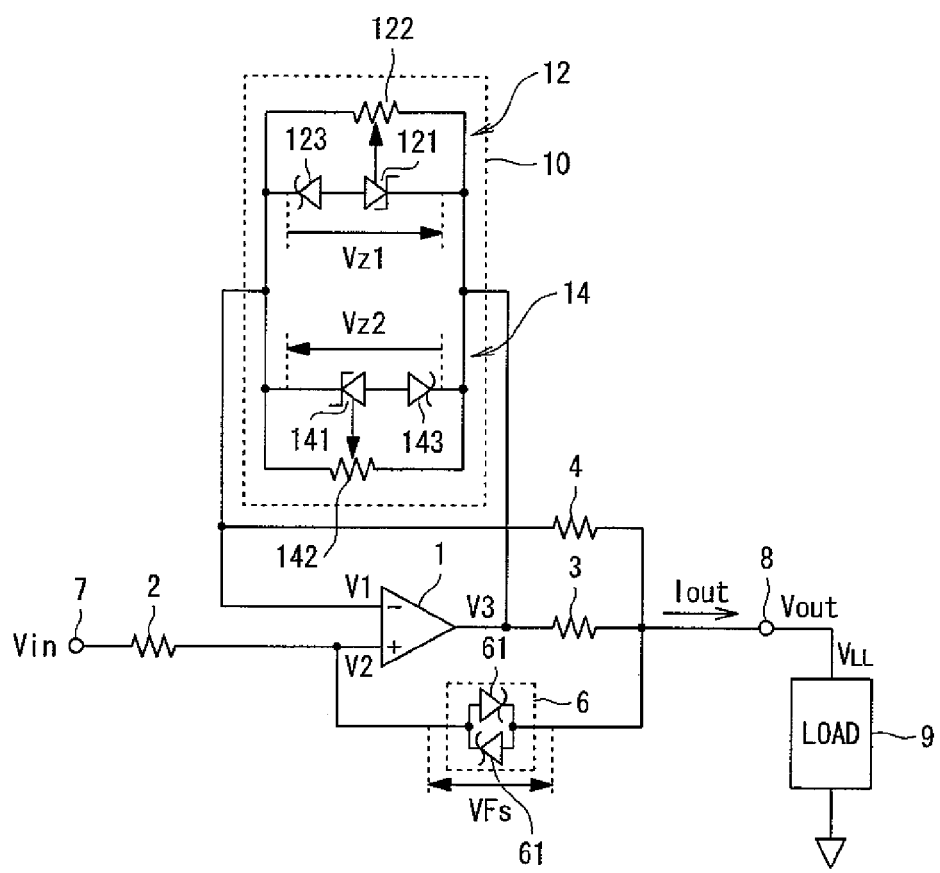
FIG. 1 is a circuit diagram illustrating the configuration of first embodiment of the voltage generator with a current limiting function of the present invention.

FIG. 1 is a circuit diagram illustrating the configuration of a first embodiment of the voltage generator with a current limiting function of the present invention.

As illustrated in FIG. 1, the first embodiment has a configuration including an operational amplifier 1, an input resistance 2, an output resistance 3, a feedback resistor 4, a clamper 10, and a clamper 6, in which an input voltage Vin is applied to an input terminal 7 and a load 9 is connected to a load connecting terminal 8.

The non-inverting input terminal (plus input terminal) of the operational amplifier 1 is configured to be fed with the input voltage Vin applied to the input terminal 7 through the input resistance 2. Between the output terminal of the operational amplifier 1 and the load connecting terminal 8, the output resistance 3 is connected.

In order to negatively feed back the output voltage Vout output from the load connecting terminal 8 to the inverting input terminal (minus input terminal) of the operational amplifier 1, the feedback resistor 4 is connected between the load connecting terminal 8 and the inverting input terminal of the operational amplifier 1.

The clamper 10 has a function for limiting the current Iout flowing into the load 9 connected to the load connecting terminal 8 and is connected between the output terminal of the operational amplifier 1 and the inverting input terminal of the operational amplifier 1. As illustrated in FIG. 1, the clamper 10 consists of a constant voltage generating variable circuit 12 and a constant voltage generating variable circuit 14, and between the output terminal of the operational amplifier 1 and the inverting input terminal of the operational amplifier 1, both of the circuits 12 and 14 are inversely connected in parallel with each other.

The constant voltage generating variable circuit 12 is a voltage clamp circuit enabling the generated voltage thereof to be varied and having a configuration in which a positive constant voltage (reference voltage) Vz1 can be generated and the voltage value can be externally controlled or externally set to an arbitrary value at the point of use. Moreover, the constant voltage generating variable circuit 14 has a configuration in which a negative constant voltage (reference voltage) Vz2 can be generated and the voltage value can be externally varied independently with the voltage value of the constant voltage Vz1 or externally set to an arbitrary value at the point of use.

More specifically, the constant voltage generating variable circuit 12 includes a constant voltage generating circuit 121 for generating the positive constant voltage Vz1, and a protection diode 123, a variable resistor 122 which can externally vary the voltage value of the constant voltage Vz1 or to set it to an arbitrary value.

Figure 2A:
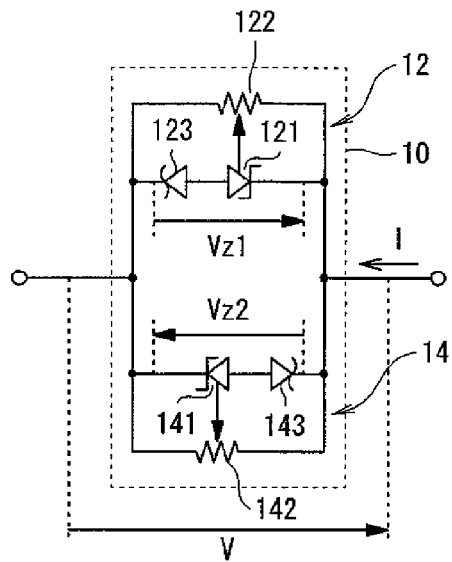
FIGS. 2A and 2B are a view illustrating a clamper in FIG. 1 and an example of the current-voltage characteristic thereof.
Figure 2B:
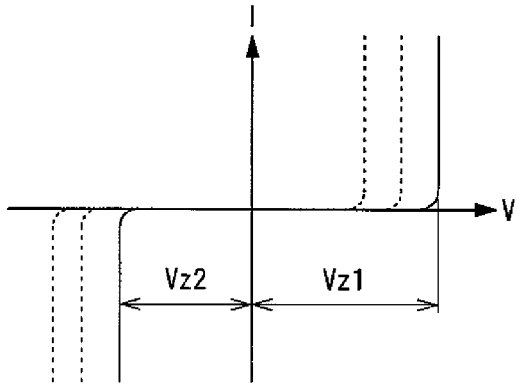

As illustrated, for example, at the right side of FIG. 2B, the constant voltage generating circuit 121 is an IC having an abrupt current-voltage characteristic in which a current varies abruptly at the predetermined constant voltage Vz1. The constant voltage generating circuit 121 has a voltage control terminal, and this enables the constant voltage Vz1 to be variable. Moreover, the constant voltage generating circuit 121 is configured so that the temperature dependence in the current-voltage characteristic becomes small.

The variable resistor 122 can vary the resistance value to set the value of the constant voltage Vz1 to a value, for example, in the range of 1.2 to 8.0 [V]. As the variable resistor 122, a mechanical variable resistor or an electronic volume of which resistance can be externally controlled, or the like, may be used. The protection diode 123 has a function for protecting the constant voltage generating circuit 121 from a reverse voltage, and it may be eliminated if possible.

Similarly, the constant voltage generating variable circuit 14 includes a constant voltage generating circuit 141 for generating a negative constant voltage Vz2, a protection diode 143, and a variable resistor 142 which can externally vary the voltage value of the constant voltage Vz2 to set it to an arbitrary value.

As illustrated, for example, at the left side of FIG. 2B, the constant voltage generating circuit 141 is an IC having an abrupt current-voltage characteristic in which current varies abruptly at the predetermined constant voltage Vz2. The constant voltage generating circuit 141 has a voltage control terminal, and this enables the constant voltage Vz2 to be variable. Moreover, the constant voltage generating circuit 141 is configured so that the temperature dependence in the current-voltage characteristic becomes small. Further, as the variable resistor 142, similar to the variable resistor 122, a mechanical variable resistor, an electronic volume of which resistance can be externally controlled, or the like, may be used. The protection diode 143 has a function for protecting the constant voltage generating circuit 141 from a reverse voltage, and it may be eliminated if possible.

As the constant voltage generating circuits 121 and 141, a commercially available voltage reference IC, for example, item number LM4041 of National Semiconductor (precision micro power shunt reference voltage) can be used. The voltage reference IC is configured to operate at a predetermined supply voltage, generate a predetermined constant voltage, and enable the generated voltage to be variable by using an externally attached variable resistor.

Here, when as the constant voltage generating circuits 121 and 141 of the constant voltage generating variable circuits 12 and 14, the voltage reference IC is used, as illustrated in FIG. 1, in order to protect the IC the diodes 123 and 143 are used.

Moreover, although when as the constant voltage generating circuits 121 and 141, the voltage reference IC is used, the operating current (idling current) flows into the feedback resistor 4, and a resistance value is applied so that the operating current does not affect the own current limiting operation.

The clamper 6 has a function for limiting the current Iout flowing into the load 9 connected to the load connecting terminal 8, and is connected between the load connecting terminal 8 and the non-inverting input terminal of the operational amplifier 1. As illustrated in the figure, in the clamper 6 two diodes 61 are inversely connected in parallel with each other.

One end side of the load 9 is connected to the load connecting terminal 8 and the other end side thereof is connected to the earth. The load 9 is a device to be tested that is a testing target of the semiconductor testing device, or the like.

Figure 3:
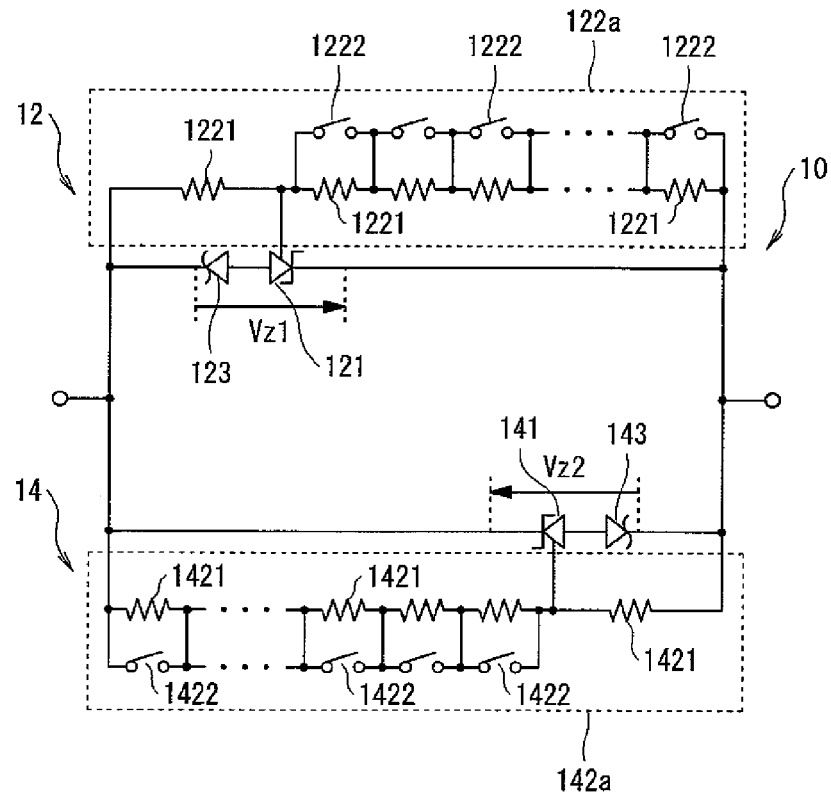
FIG. 3 is a circuit diagram illustrating a modified example of the configuration of the clamper in FIG. 1.

FIG. 3 is an example of a configuration in which the variable resistors 122 and 142 of the clamper 10 illustrated in FIG. 1 are replaced by variable resistors 122*a* and 142*a*, respectively.

The variable resistor 122*a* is a combination of a plurality of fixed resistors 1221 and a plurality of switches 1222. In other words, the variable resistor 122*a* has a configuration in which the plurality of fixed resistors 1221 are connected in series, and the fixed resistors 1221 except one of them are connected to each of the switches 1222 in parallel, and the resistance value thereof can be varied by externally controlling the on-off of the switches 1222. As the resistance values of each of the plurality of fixed resistors 1221, resistance values that lead the desired plurality of constant voltages Vz1 and Vz2, are applied, respectively.

The variable resistor 142*a* is a combination of a plurality of fixed resistors 1421 and a plurality of switches 1422, and configured in the same manner as the variable resistor 122*a*.

In addition, as the switches 1222 and 1422, various types of switches, such as a mechanical switch, an electronic switch, and an optical MOS relay switch, can be used.

Next, an example of the operation of the first embodiment consists of such a configuration will be described with reference to FIGS. 1, 2A and 2B.

(a) An Operation in Case of No Load

When the load 9 is not connected to the load connecting terminal 8 and the load current Iout is zero, between the output voltage Vout of the load connecting terminal 8, the voltage V1 of the inverting input terminal of the operational amplifiers 1, the voltage V2 of the non-inverting input terminal of the operational amplifiers 1, and the input voltage Vin, the following relationship is satisfied.

$$Vout = V1 = V2 = Vin \quad (1)$$

For this reason, the circuit operates as a voltage follower. At that time, since there is no potential difference between both ends of each of the clampers 6 and 10 and no current flows between them, the clampers 6 and 10 impart no affect on the operation of the circuit.

(b) A Case of a Few Load Current (When Current is Not Limited)

Now, a case in which the load 9 is connected to the load connecting terminal 8, and the input voltage Vin and the load voltage VLL of the load 9 satisfies Vin>VLL in an instance, will be described.

Since the load voltage VLL is negatively fed back to the inverting input terminal of the operational amplifier 1 through the feedback resistor 4, the relationship between the load voltage VLL, the input voltage V1 of the inverting input terminal of the operational amplifier 1 and the input voltage V2 of the non-inverting input terminal of the operational amplifier 1 becomes: V2>V1, resulting in that the output voltage V3 is risen in an instant by the operational amplifier 1.

As a result, the current flowing into the load 9 through the output resistance 3 increases, and the output voltage Vout rises to the input voltage Vin in an instant. After that, the operational amplifier 1 becomes in a stationary state. At that time, since the clampers 6 and 10 are less than the constant voltages Vz1 and Vz2, respectively, they are still in a non-operation state. At that time, the relationship of formula (1) is also satisfied, thereby, the circuit operates as the voltage follower, and the load 9 is fed with the same voltage as the input voltage Vin.

In addition, although the above mentioned description is a case in which Vin>VLL is satisfied in an instant, when Vin<VLL is satisfied, the circuit operates similarly as the above mentioned case but only the direction of the output current Iout is reversed.

(c) In Case of a Large Load Current (When Current is Limited)

In this case, a case in which the load 9 becomes in an over current state in an instant, is described.

In this case, even if the output voltage V3 of the operational amplifier 1 ascends or descends, the output voltage Vout does not ascend or descend, and the relationship between the output voltage Vout and the voltage VLL of the load 9 is still satisfies the following formula (2).

$$Vout = VLL \quad (2)$$

Here, as illustrated in FIG. 1, between the non-inverting input terminal of the operational amplifier 1 and the load connecting terminal 8, the clamper 6 is provided. Moreover, if the resistance value of the input resistance 2 is a large value to an extent (for example, several hundreds kΩ to several kΩ), the input voltage V2 of the non-inverting input terminal of the operational amplifier 1 satisfies the following formula (3).

$$Vout - VFs \leq V2 \leq Vout + VFs \quad (3)$$

Where, VFs is the forward voltage of diodes constituting the clamp 6.

On the contrary, as illustrated in FIG. 1, between the inverting input terminal of the operational amplifier 1 and the output terminal of the operational amplifier 1, the clamper 10 is provided. Moreover, if the resistance value of the feedback resistor 4 is a large value to an extent (for example, several hundreds kΩ to several kΩ), the input voltage V1 of the inverting input terminal of the operational amplifier 1 satisfies the following formula (4).

$$V3 - Vz1 \leq V1 \leq V3 + Vz2 \quad (4)$$

Where, Vz1 is a constant voltage generated by the constant voltage generating variable circuit 12, and Vz2 is a constant voltage generated by the constant voltage generating variable circuit 14 (refer to FIGS. 2A and 2B).

If the resistance value of the output resistance 3 is denoted as Rout, the output current Iout can be expressed by the following formula (5).

$$Iout = (V3 - Vout)/Rout \quad (5)$$

Here, if the output of the operational amplifier 1 is supposed to be not saturated, by imaginary short, the following formula (6) is satisfied.

$$V1 = V2 \quad (6)$$

Next, using formulas (2) to (6), the maximum value and the minimum value of the output current Iout will be calculated, respectively.

From formulas (3), (4) and (6), the following formulas (7) and (8) can be derived.

$$V3 - Vz1 \leq Vout + VFs \quad (7)$$

$$Vout - VFs \leq V3 + Vz2 \quad (8)$$

By modifying these formulas, the following formulas (9) and (10) can be obtained.

$$V3 - Vout \leq Vz1 + VFs \quad (9)$$

$$V3 - Vout \geq -Vz2 - VFs \quad (10)$$

By dividing both sides of the formulas with Rout and using formula (5), the output current Iout satisfies the following formula (11).

$$-(Vz2 + VFs)/Rout \leq Iout \leq (Vz1 + VFs)/Rout \quad (11)$$

As is clear from formula (11), the lower limit value of the output current Iout is determined by (Vz2+VFs)/Rout, and the upper limit value of the output current Iout is determined by (Vz1+VFs)/Rout. In other words, since in the first embodiment, the lower and upper limit values of the output current Iout are determined by the clampers 6 and 10 and the output resistance 3, they will act as a current limiting circuit.

As described above, since according to the first embodiment, the current-voltage characteristic of the clamper 10 is abrupt as illustrated in FIG. 2B, when a current is limited by the clamper 10, the current can be limited as soon as it reaches to the limit value thereof, resulting in higher responsibility in a current limitation than that of conventional one.

Moreover, since according to the first embodiment, the temperature dependence of the clamper 10 is configured to be small, the temperature dependence with respect to the current limit value can be caused to be smaller than that of conventional one.

Further, according to the first embodiment, the current limit value can be set arbitrarily depending on the application at the point of use, thereby, resulting in improvement of usability.

A Second Embodiment of the Voltage Generator

FIG. 4 is a circuit diagram illustrating the configuration of a second embodiment of the voltage generator with a current limiting function of the present invention.

As illustrated in FIG. 4, the second embodiment has a configuration including an operational amplifier 1, an input resistance 2, a variable output resistance 3a, a feedback resistor 4, a clamper 10a, and a clamper 6, in which an input voltage Vin is applied to an input terminal 7 and a load is connected to a load connecting terminal 8.

In other words, the second embodiment has a configuration based on the configuration of the first embodiment illustrated in FIG. 1, in which the clamper 10 illustrated in FIG. 1 is replaced by the clamper 10a and the fixed output resistance 3 illustrated in FIG. 1 is replaced by the variable output resistance 3a.

As illustrated in FIG. 4, the clamper 10a has a configuration in which the variable resistor 122 of the constant voltage generating variable circuit 12 illustrated in FIG. 1 is replaced by two fixed resistors 124 and 125, and the variable resistor 142 of the constant voltage generating variable circuit 14 illustrated in FIG. 1 is replaced by two fixed resistors 144 and 145.

Accordingly, in the clamper 10a, the constant voltages Vz1 and Vz2 generated by the constant voltage generating variable circuits 12 and 14, respectively, become constant values, thereby, they cannot be varied or set to arbitrary values similar to the clamper 10 illustrated in FIG. 1.

Therefore, the second embodiment is configured so that the fixed output resistance 3 illustrated in FIG. 1 is replaced by the variable output resistance 3a. For this reason, in the second embodiment, by using the variable output resistance 3a, similarly to the first embodiment, the current limit value flowing into the output current Iout can also be varied or set to an arbitrary value (refer to formula (11)).

The variable output resistance 3a consists of a variable resistor. The variable resistor, similarly to the variable resistor 122 in FIG. 1, uses a mechanical variable resistor, an electronic volume, or the like.

As mentioned above, according to the second embodiment, the same action and effect as those of the first embodiment can be achieved.

A Third Embodiment of the Voltage Generator

Figure 5:
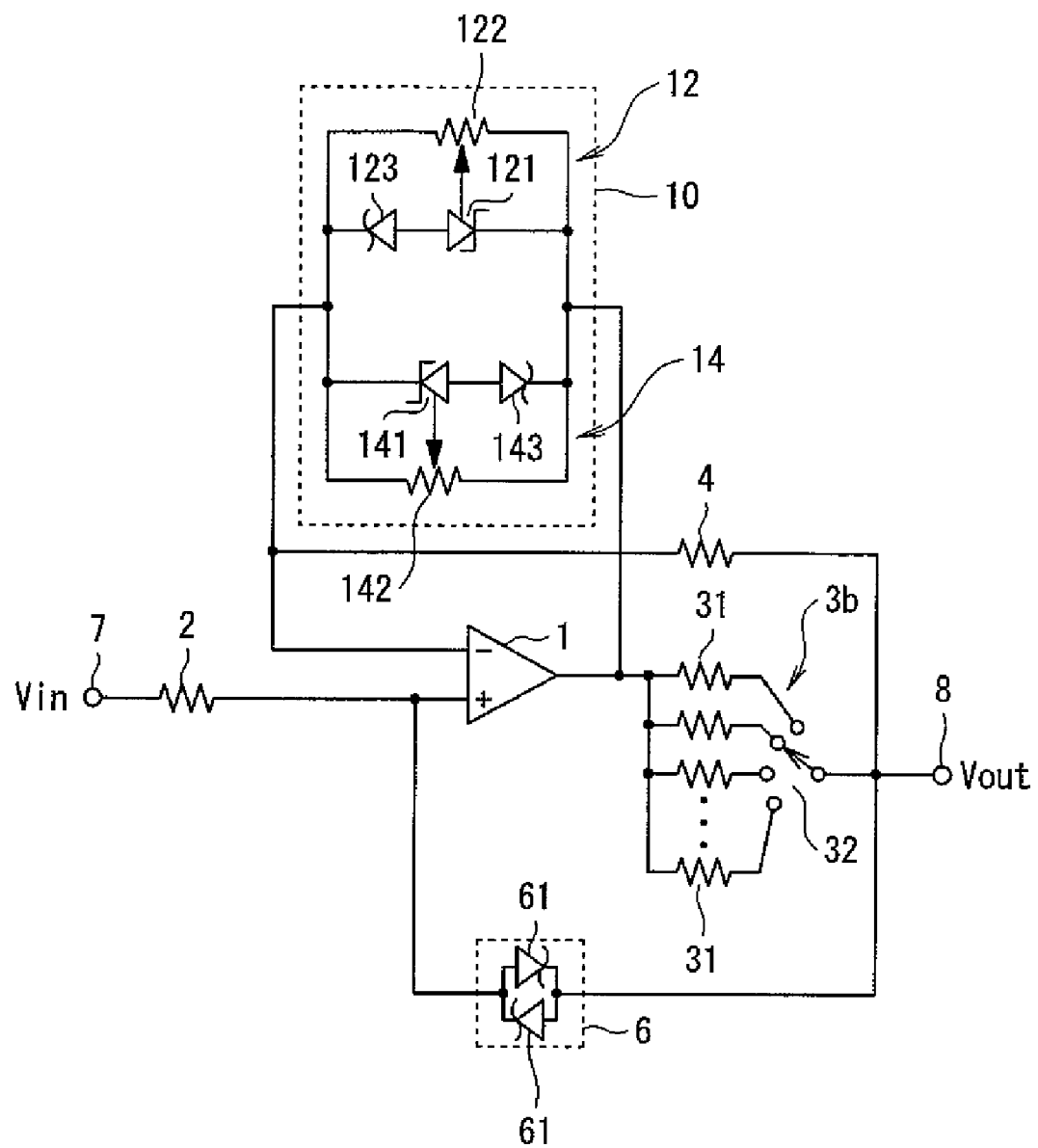
FIG. 5 is a circuit diagram illustrating the configuration of a third embodiment of the voltage generator with a current limiting function of the present invention.
Figure 6:
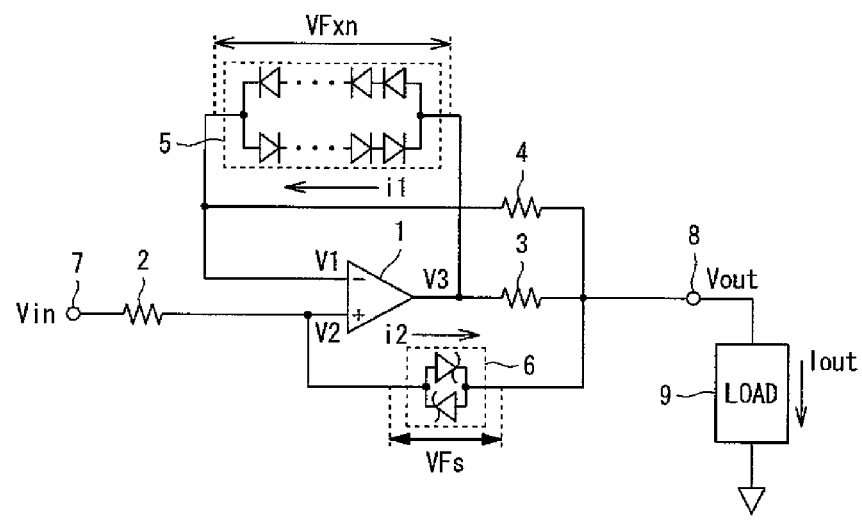
FIG. 6 is a circuit diagram of a conventional voltage generator with a current limiting function.
Figure 7A:
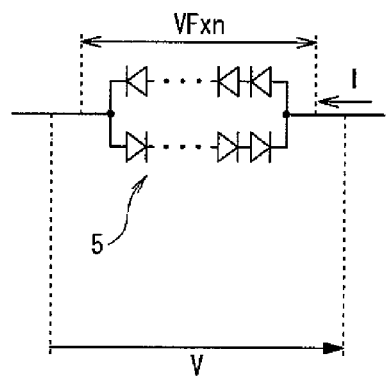
FIGS. 7A and 7B are a view illustrating a clamper in FIG. 6 and an example of the current-voltage characteristic thereof.
Figure 7B:
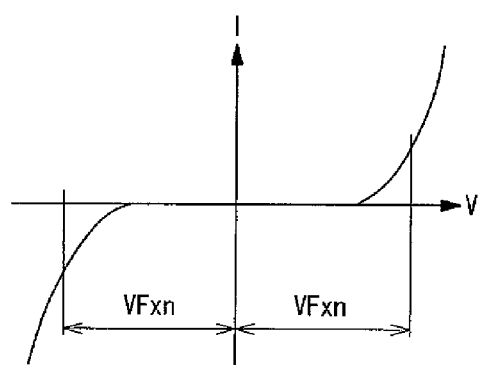

FIG. 5 is a circuit diagram illustrating the configuration of a third embodiment of the voltage generator with a current limiting function of the present invention.

As illustrated in FIG. 5, the third embodiment has a configuration including an operational amplifier 1, an input resistance 2, a selective output resistance 3b, a feedback resistor 4, a clamper 10, and a clamper 6, in which an input voltage Vin is applied to an input terminal 7, and a load is connected to a load connecting terminal 8. In addition, to the clamper 10, the circuit configuration in FIG. 3 may be applied.

In other words, the third embodiment has a configuration based on the configuration of the first embodiment illustrated in FIG. 1, in which the fixed output resistance 3 illustrated in FIG. 1 is replaced by the selective output resistance 3b.

As illustrated in FIG. 5, the selective output resistance 3b includes a plurality of fixed output resistances 31 and a selection switch 32 for selecting one of them, and configured so that at the point of use, the selection switch 32 is controlled externally by the magnitude of the load 9 thereof or the like, and one of the plurality of output resistances 31 is selected. Here, the plurality of output resistances 31 may have the same resistance value or may have different resistance values, respectively. Moreover, each of the resistance values may be weighted.

As mentioned above, since the third embodiment is configured so that not only the constant voltages Vz1 and Vz2 generated by the clamper 10 can be varied but also one of the plurality of output resistances 31 can be selectively used, it is possible to delicately vary the current limit value of the output current Iout or to set it to an arbitrary value, depending on application (refer to formula (11)).

Further, according to the third embodiment, the same action and effect as those of the first embodiment can be achieved.

An Embodiment of the Semiconductor Testing Device

As the load to be connected to the voltage generator with a current limiting function according the above mentioned embodiments, an electronic measuring instrument, a device to be tested that is the testing target of a semiconductor testing device, or the like, is suitable. For this reason, the voltage generator with a current limiting function according to the present invention is applicable to the semiconductor testing device or the like.

For this reason, when being applied to the semiconductor testing device of the present invention, the semiconductor testing device will have the voltage generator with a current limiting function according to any one of the above mentioned embodiments. In this case, when the semiconductor device is tested, the voltage generator with a current limiting function will feed a desired voltage to the device to be tested. And, if large current flows into the device to be tested during feeding the voltage, the current can be limited, and thereby the device to be tested can be protected.

Another Embodiment

In addition, in the circuit configuration illustrated in FIG. 1, a configuration in which an ampere meter (not illustrated in the figure) is connected to the load connecting terminal 8 through a switch may be used. In this case, the current limit values of the variable resistors 122 and 142 or the electronic volume can be controlled.

INDUSTRIAL APPLICABILITY

According to the present invention, not only the current limit value can be arbitrarily set but also a good current limiting characteristic can be obtained.

Moreover, according to the present invention, temperature dependence with respect to the current limit value can be smaller than that of the conventional one.

Further, according to the present invention, the current limit value can be set arbitrarily at the point of use, thereby, enabling the current limitation to have a degree of freedom.

The invention claimed is:

1. A semiconductor testing device comprising a voltage generator with current limiting for feeding a desired load voltage to a device to be tested, the device being a load of which load current is limited to a predetermined value or less, wherein the voltage generator with current limiting comprises:

an operational amplifier for receiving a voltage signal corresponding to the load voltage by a non-inverting input terminal through an input resistance and feeding a predetermined load voltage to the load;

an output resistance connected between an output terminal of the operational amplifier and one end of the load, the output resistance having a fixed or an externally variable resistance value;

a feedback resistor connected between one end of the load and an inverting input terminal of the operational amplifier;

a first clamper connected between the output terminal of the operational amplifier and the inverting input terminal of the operational amplifier, the first clamper having a pre-set or an externally variable clamp voltage; and a second clamper connected between one end of the load and the non-inverting input terminal of the operational amplifier.

2. A voltage generator with current limiting for generating a voltage to be fed to a load of which load current is limited, comprising:

an operational amplifier;

an output resistance connected between an output terminal of the operational amplifier and a load connecting terminal;

a feedback resistor connected between the load connecting terminal and an inverting input terminal of the operational amplifier;

a first clamper connected between the output terminal of the operational amplifier and the inverting input terminal of the operational amplifier; and a second clamper connected between the load connecting terminal and a non-inverting input terminal of the operational amplifier and configured with diodes, wherein the first clamper comprises:

constant voltage generating means for generating a predetermined voltage and limiting a current flowing into the output resistance, the constant voltage generating means having a predetermined abrupt current-voltage characteristic; and resistance varying means for varying the constant voltage generated by the constant voltage generating means.

3. The voltage generator with current limiting according to claim 2, wherein the constant voltage generating means is configured so that the current-voltage characteristic of the constant voltage generating means has small temperature dependence.

4. The voltage generator with current limiting according to claim 3, wherein the constant voltage generating means consists of:

first constant voltage generating means for generating a positive constant voltage; and second constant voltage generating means for generating a negative constant voltage, and wherein the resistance varying means consists of:

first resistance varying means for externally varying the positive constant voltage generated by the first constant voltage generating means to set the positive constant voltage an arbitrary value; and second resistance varying means for externally varying the negative constant voltage generated by the second constant voltage generating means to set the negative constant voltage an arbitrary value.

5. The voltage generator with current limiting according to claim 3, wherein the constant voltage generating means consists of a predetermined voltage reference IC configured so as to flow an operation current into the feedback resistor, the operation current being configured so as to be within a range in which the operation current does not affect the current limiting operation.

6. The voltage generator with current limiting according to claim 3, wherein the resistance varying means consists of one of a mechanical variable resistor, an electronic volume, or a combination circuit of fixed resistance and switches.

7. The voltage generator with current limiting according to claim 3, wherein the output resistance is configured with the resistance varying means.

8. The voltage generator with current limiting according to claim 2, wherein the constant voltage generating means consists of:

first constant voltage generating means for generating a positive constant voltage; and second constant voltage generating means for generating a negative constant voltage, and wherein the resistance varying means consists of:

first resistance varying means for externally varying the positive constant voltage generated by the first constant voltage generating means to set the positive constant voltage an arbitrary value; and second resistance varying means for externally varying the negative constant voltage generated by the second constant voltage generating means to set the negative constant voltage an arbitrary value.

9. The voltage generator with current limiting according to claim 8, wherein the constant voltage generating means consists of a predetermined voltage reference IC configured so as to flow an operation current into the feedback resistor, the operation current being configured so as to be within a range in which the operation current does not affect the current limiting operation.

10. The voltage generator with current limiting according to claim 8, wherein the resistance varying means further consists of one of a mechanical variable resistor, an electronic volume, or a combination circuit of fixed resistance and switches.

11. The voltage generator with current limiting according to claim 8, wherein the output resistance is configured with the resistance varying means.

12. The voltage generator with current limiting according to claim 2, wherein the constant voltage generating means consists of a predetermined voltage reference IC configured so as to flow an operation current into the feedback resistor, the operation current being configured so as to be within a range in which the operation current does not affect the current limiting operation.

13. The voltage generator with current limiting according to claim 12, wherein the resistance varying means consists of one of a mechanical variable resistor, an electronic volume, or a combination circuit of fixed resistance and switches.

14. The voltage generator with current limiting according to claim 12, wherein the output resistance is configured with the resistance varying means.

15. The voltage generator with current limiting according to claim 2, wherein the resistance varying means consists of one of a mechanical variable resistor, an electronic volume, or a combination circuit of fixed resistance and switches.

16. The voltage generator with current limiting according to claim 15, wherein the output resistance is configured with the resistance varying means.

17. The voltage generator with current limiting according to claim 2, wherein the output resistance is configured with the resistance varying means.

18. The voltage generator with current limiting according to claim 2, wherein the resistance varying means is replaced by a fixed resistance, and the output resistance is replaced by the resistance varying means.

19. A semiconductor testing device comprising a voltage generator for generating a desired voltage to be applied on a device to be tested, wherein the voltage generator is the voltage generator with current limiting according to claim 2.

* * * * *